US010256396B2

(12) United States Patent
Kim et al.

(10) Patent No.: US 10,256,396 B2
(45) Date of Patent: Apr. 9, 2019

(54) MAGNETIC SENSOR AND METHOD OF FABRICATING THE SAME

(71) Applicant: Magnachip Semiconductor, Ltd., Cheongju-si (KR)

(72) Inventors: Kwan Soo Kim, Cheongju-si (KR); Dong Joon Kim, Cheongju-si (KR); Seung Han Ryu, Cheongju-si (KR); Hee Baeg An, Cheongju-si (KR); Jong Yeul Jeong, Cheongju-si (KR); Kyung Soo Kim, Cheongju-si (KR); Kang Sup Shin, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/204,630

(22) Filed: Jul. 7, 2016

(65) Prior Publication Data
US 2016/0322561 A1 Nov. 3, 2016

Related U.S. Application Data

(62) Division of application No. 13/951,093, filed on Jul. 25, 2013, now Pat. No. 9,419,206.

(30) Foreign Application Priority Data

Mar. 8, 2013 (KR) .................. 10-2013-0025230

(51) Int. Cl.
*H01L 21/00* (2006.01)
*H01L 43/04* (2006.01)
*H01L 43/06* (2006.01)
*H01L 43/14* (2006.01)
*G01R 33/00* (2006.01)
*G01R 33/07* (2006.01)

(52) U.S. Cl.
CPC .......... *H01L 43/04* (2013.01); *G01R 33/0011* (2013.01); *G01R 33/0052* (2013.01); *G01R 33/07* (2013.01); *H01L 43/065* (2013.01); *H01L 43/14* (2013.01)

(58) Field of Classification Search
CPC ...................................................... H01L 43/04
USPC ......................................................... 438/48
See application file for complete search history.

(56) References Cited

U.S. PATENT DOCUMENTS 6,004,873 A * 12/1999 Jang .................. H01L 21/02164
257/E21.279
6,356,068 B1 3/2002 Steiner et al.
6,396,114 B1 5/2002 Yoshinaga
(Continued)

OTHER PUBLICATIONS

Chinese Office Action dated Jul. 25, 2017 in corresponding Chinese Patent Application No. 201310389015.7 (8 pages in Chinese).
(Continued)

Primary Examiner — Ajay Arora
(74) Attorney, Agent, or Firm — NSIP Law

(57) ABSTRACT

Provided are a magnetic sensor and a method of fabricating the same. The magnetic sensor includes: hall elements disposed in a substrate, a protection layer disposed on the substrate, a seed layer disposed on the protection layer, and an integrated magnetic concentrator (IMC) formed on the seed layer, the seed layer and the IMC each having an uneven surface.

22 Claims, 19 Drawing Sheets

(56) References Cited

U.S. PATENT DOCUMENTS

| | | | |
|---|---|---|---|
| 6,545,462 B2* | 4/2003 | Schott | G01D 5/145 |
| | | | 324/207.2 |
| 8,169,215 B2 | 5/2012 | Kataoka et al. | |
| 2003/0224613 A1 | 12/2003 | Ramanathan et al. | |
| 2005/0274997 A1 | 12/2005 | Gaidis et al. | |
| 2006/0255797 A1 | 11/2006 | Taylor et al. | |
| 2008/0042226 A1 | 2/2008 | Nagai | |
| 2008/0170329 A1* | 7/2008 | Thangaraj | G11B 5/667 |
| | | | 360/131 |
| 2009/0188805 A1 | 7/2009 | Moffat et al. | |
| 2011/0234214 A1 | 9/2011 | Jones | |
| 2013/0015839 A1 | 1/2013 | Franke | |
| 2014/0042435 A1* | 2/2014 | Yamazaki | H01L 29/7869 |
| | | | 257/43 |

OTHER PUBLICATIONS

Korean Office Action dated Dec. 20, 2017 in corresponding Korean Patent Application No. 10-2013-0025230 (8 pages in Korean).

* cited by examiner

MAGNETIC SENSOR AND METHOD OF FABRICATING THE SAME

CROSS-REFERENCE TO RELATED APPLICATION

This application is a division of U.S. patent application Ser. No. 13/951,093 filed on Jul. 25, 2013, now U.S. Pat. No. 9,419,206 issued on Aug. 16 2016, which claims the benefit under 35 USC 119(a) of Korean Patent Application No. 10-2013-0025230 filed on Mar. 8, 2013, in the Korean Intellectual Property Office, the entire disclosures of which are incorporated herein by reference for all purposes.

BACKGROUND

1. Field

The following description relates to a magnetic sensor and a method of fabricating the same, and to a magnetic sensor including hall elements and an integrated magnetic concentrator (IMC) that may detect a direction of a magnetic field and a method of fabricating the same.

2. Description of Related Art

A magnetic sensor is used to detect a magnetic field. A magnetic sensor that combines a hall element and an integrated magnetic concentrator (IMC) may be used to detect a direction of a magnetic field.

In an example of such a magnetic sensor, an IMC is formed of a magnetic material with a flat shape. A hall-effect device is disposed in an edge portion of the IMC of the magnetic sensor. Such a magnetic senor may be used to detect a direction of a three-dimensional magnetic field.

The magnetic sensor having the configuration is effective in detecting a horizontal magnetic field and amplifying a magnetic field in a region in which the hall-effect device is disposed through the IMC.

FIG. 1 is a plan view illustrating a magnetic sensor disclosed in U.S. Pat. No. 6,545,462. The reference numeral 3 denotes an IMC, and the reference numerals 2.1 to 2.6 denote hall-effect elements.

The magnetic sensor having the configuration as illustrated in FIG. 1 includes an IMC 3 having a flat upper surface and a flat lower surface. The flat shape of the IMC 3 results in high stress to the hall-effect elements 2.1 to 2.6 and causes an offset voltage of the magnetic sensor to increase. Therefore, it is desirable to reduce the stress and to lower the offset voltage of such a magnetic sensor.

In the magnetic sensor of FIG. 1, a voltage of the hall-effect element has to be zero (0) when a magnetic field is not applied. However, the voltage of the hall-effect element may have values other than zero (0). The offset voltage denotes a voltage difference when the voltage of the hall-effect element has values other than zero (0). As the offset voltage increases, malfunction is more likely to occur in the magnetic sensor. Further, when a magnetic field is applied to a device having a large offset voltage, the change in the voltage of the hall-effect element is insignificant and the sensitivity of the device is reduced. In other words, a ratio of signal to noise is reduced because the offset voltage is large. In applications in which fine changes in magnetic field are detected, it is difficult to detect the fine changes with a magnetic sensor having a high offset voltage.

SUMMARY

In one general aspect, there is provided a magnetic sensor including: hall elements disposed in a substrate; a protection layer disposed on the substrate; a seed layer disposed on the protection layer; and an integrated magnetic concentrator (IMC) formed on the seed layer, the seed layer and the IMC each having an uneven surface.

An area of the IMC may be equal to or larger than an area of the seed layer.

The protection layer may include a plurality of protrusions formed on a surface thereof.

The uneven surface of the seed layer and the uneven surface of the IMC may each have a cross-section in which a plurality of concave portions and a plurality of convex portions are arranged.

One of the hall elements may overlap with an edge portion of the IMC in a vertical direction.

The protection layer may include a passivation insulating layer and a buffer layer.

The protection layer may further include a corrosion barrier layer.

The corrosion barrier layer may include a silicon oxide layer or a silicon nitride layer.

The corrosion barrier layer may have a thickness of 5 to 50 nm.

The corrosion barrier layer may be interposed between the passivation insulating layer and the buffer layer.

The protrusions may include polyimide.

The IMC may include a nickel-iron (NiFe) alloy, and an iron content of the nickel-iron alloy may be in a range of 10 to 30 atomic %.

The seed layer may include a titanium tungsten (TiW) layer and a copper (Cu) layer.

In another general aspect, there is provided a method of fabricating a magnetic sensor, the method involving: forming a protection layer on a substrate in which a plurality of hall elements are disposed; forming a buffer layer on the protection layer; forming a plurality of protrusions on a surface of the buffer layer; forming a seed layer having an uneven surface corresponding to the plurality of protrusions; and forming an integrated magnetic concentrator (IMC) having an uneven surface on the seed layer.

The uneven surface of the seed layer or the uneven surface of the IMC may have a cross-section in which a plurality of concave portions and a plurality of convex portions are arranged.

The seed layer may include a titanium tungsten (TiW) layer and a copper (Cu) layer.

The general aspect of the method may further involve forming a corrosion barrier layer.

The corrosion barrier layer may include a silicon oxide layer or a silicon nitride layer.

The corrosion barrier layer may be formed between the protection layer and the buffer layer.

The protrusions may include polyimide.

In another general aspect, there is provided a magnetic sensor including: hall elements; and an integrated magnetic concentrator (IMC) disposed above the hall elements, the IMC having an uneven surface, and the plurality hall elements being disposed below the IMC such that an edge portion of the IMC overlaps with a width of the hall elements in a vertical direction.

The uneven surface of the IMC may include an elevated portion in a shape of one or more concentric rings.

Other features and aspects may be apparent from the following detailed description, the drawings, and the claims.

Figure 1:
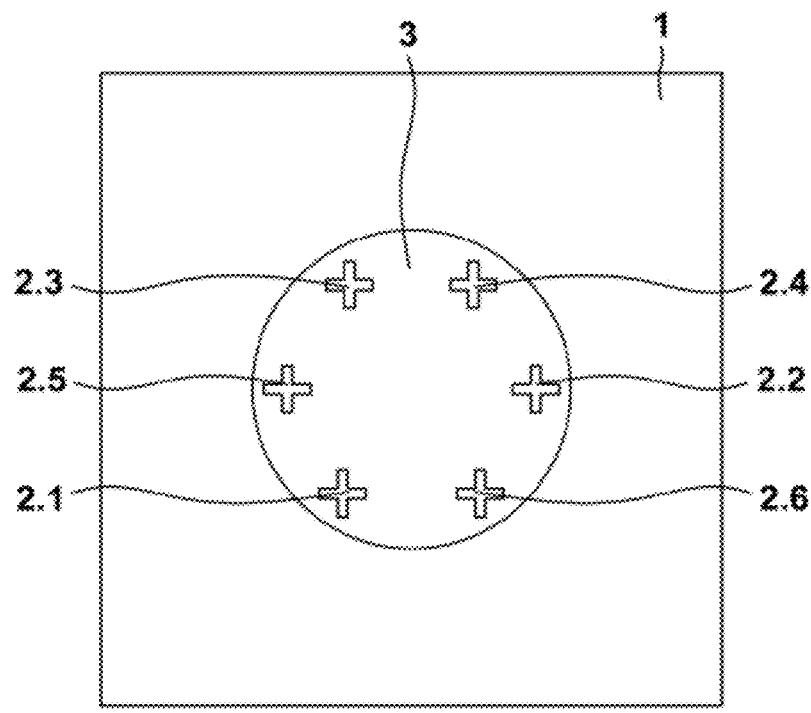
FIG. 1 is a plan view of a magnetic sensor.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that, although the terms first, second, A, B, etc. may be used herein in reference to elements of various examples, such elements should not be construed as to be limited by these terms. For example, a first element could be termed a second element, and a second element could be termed a first element, without departing from the scope of the present disclosure. Herein, the term "and/or" includes any and all combinations of one or more referents.

The terminology used herein is for the purpose of describing an example only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, various examples will be described with reference to the accompanying drawings.

Figure 2A:
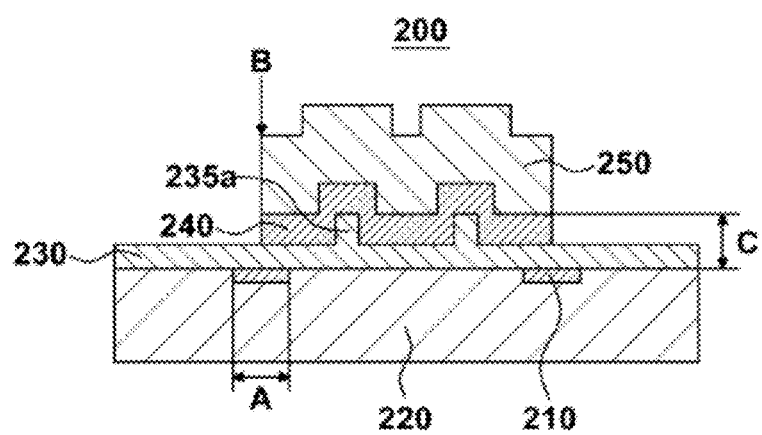
FIG. 2A is a cross-sectional view illustrating an example of a magnetic sensor.

FIG. 2A is a cross-sectional view illustrating an example of a magnetic sensor.

Referring to FIG. 2A, the magnetic sensor 200 includes a substrate 220 in which a plurality of hall elements 210 are formed. The substrate 220 may be a semiconductor substrate. A protection layer 230 is formed on the substrate 220, and a seed layer 240 is formed on the protection layer 230. An integrated magnetic concentrator (IMC) 250 is formed on the seed layer 240. The seed layer 240 and the IMC 250 each have an uneven surface. The protection layer 230 may include a passivation insulating layer and a buffer layer. The passivation insulating layer can be formed on the buffer layer, or the buffer layer can be formed on the passivation insulating layer. The passivation insulating layer may include a silicon oxide layer and a silicon nitride layer. The passivation insulating layer may prevent moisture from penetrated into a chip. A corrosion barrier layer configured to prevent a pad from being corroded may be further formed on the passivation insulating layer. The corrosion barrier layer may include a silicon oxide layer. The buffer layer may include a polymer material such as polyimide.

To form the uneven surface of the seed layer 240, a plurality of protrusions (or elevations) 235a are formed on a surface of the protection layer 230. A width and height of the protrusions 235a and the number of protrusions 235a are designed to minimize stress affecting the hall element 210. For example, the width of the protrusion 235a may be in a range of 5 to 30 μm, the height of the protrusion 235a may be in a range of 1 to 10 μm, and the number of protrusions 235a may be 1 to 8. As the number of protrusions 235a is increased, the stress affecting the hall element may be minimized Since the protrusions 235a are formed by etching the buffer layer 230, the protrusions are formed of a polymer material such as polyimide.

Each of the IMC 250 and the seed layer 240 may have a circular shape or a polygonal shape in a plan view.

To increase sensibility of the hall element 210 to a magnetic field, the hall element 210 is disposed so that a portion of the hall element 210 overlaps with an edge portion B of the IMC 250 in the vertical direction of the magnetic sensor 200. Referring to FIG. 2A, the hall element 210 may have a width A, and the edge portion B of the IMC 250 may overlap with the width A in the vertical direction. For example, the width of the hall element 210 may be equal to or less than 50 μm. The hall element 210 may be disposed so that a center portion of the hall element 210 overlaps with an edge portion B of the IMC 250, the center portion of the hall element 210 being disposed within the width A of the hall element 210. In an example in which the hall element 210 has a width of approximately 50 μm, the edge portion B of the IMC 250 may overlap with a center portion of the hall element 210 approximately 25 μm from the edge of the hall element 210, for example.

A distance C from a top of the hall element 210 to a bottom of the IMC 250 may be, for example, in a range of 1 to 30 μm.

The IMC 250 may be formed of a magnetic material, and the magnetic material may be formed using electroplating.

The magnetic material may include an alloy containing two or more components selected from the group consisting of nickel (Ni), iron (Fe), cobalt (Co), and manganese (Mn). The magnetic material may have a coefficient of thermal expansion in a range of 5 to 20 ppm/° C. When the magnetic material includes a NiFe alloy, the magnetic material may have a composition in which an iron content of the alloy is in a range of 10 to 30 atomic %. An intensity of a magnetic field may be determined according to the composition of the magnetic material. The iron content in the composition of the magnetic material may affect coercive force. The iron content in the range of 10 to 30 atomic % is determined to correspond to the appropriate coercive force.

The seed layer 240 may include a resin or a metal. The uneven surface of the seed layer 240 may have a cross-section in which a plurality of concave portions and a plurality of convex portions are regularly or irregularly arranged. For example, the plurality of convex portions may be arranged with a regular spacing therebetween, or may be arranged symmetrically with respect to the center of the seed layer 240.

Figure 2B:
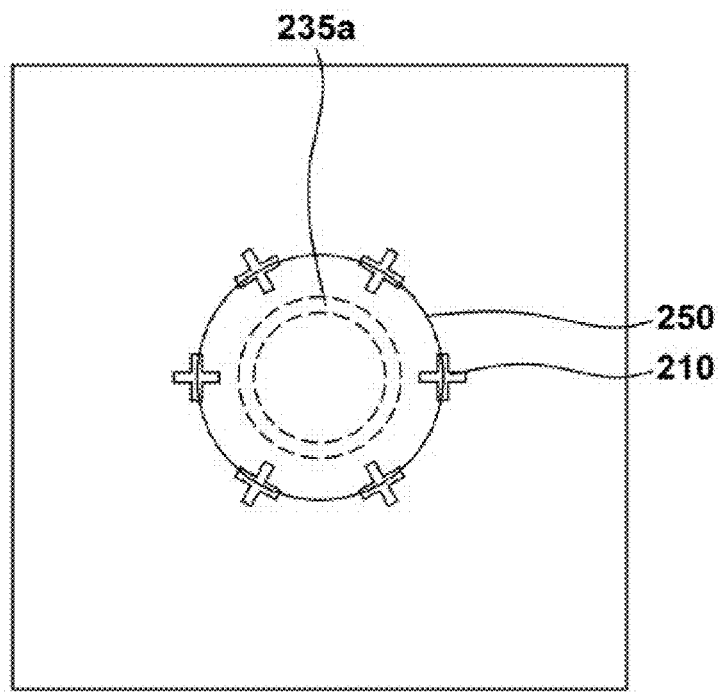
FIG. 2B is a plan view of the magnetic sensor illustrated in FIG. 2A.

Referring to FIG. 2B, a plan view of the magnetic sensor 200 of FIG. 2A is illustrated. In this example, the protrusions 235a have a shape of a circle in the plan view, and the uneven surface of the seed layer 240 and the uneven surface of the IMC 250 also have the shape of a circle. However, in other examples, the uneven surface of the seed layer 240 may have a plan view in which a plurality of circles or a plurality of polygons are arranged in a loop shape. The plurality of circles may be arranged as to form concentric circles with respect to a center of the IMC 250. For example, an upper surface of an IMC 250 may include elevations in the shape of two or more concentric circles. Further, in other examples, the IMC 250 may have a polygonal shape, rather than a circular shape.

Referring to FIG. 2B, the hall elements 210 has a plan view shape of a cross, and a center portion of the cross is aligned along an edge of the IMC 250. However, in other examples, the hall elements 210 may have various different shapes, such as a rectangular shape or a polygonal shape. Further, while six hall elements 210 are arranged along an edge of the IMC 250 illustrated in FIG. 2B, in other examples, the number of hall elements 210 may vary.

The IMC 250 formed on the seed layer 240 has an uneven surface with a general shape that corresponds to the uneven surface of the seed layer 240. The stress affecting the hall element 210 may be reduced through the uneven surfaces of the IMC 250 and seed layer 240, as compared with a structure in which the IMC and seed layer have flat surfaces. An area of the IMC 250 may be equal to or larger than that of the seed layer 240 according to a fabrication method. Therefore, a magnitude of an offset voltage may be reduced and sensibility of the hall element 210 may be improved.

Figure 3A:
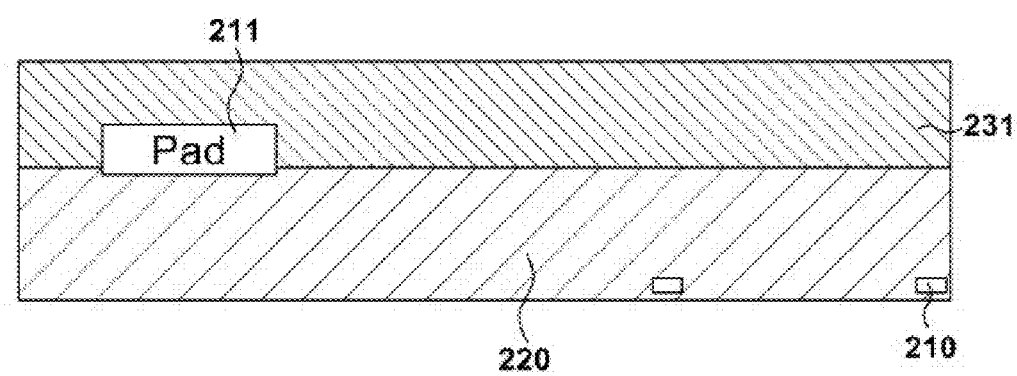
FIGS. 3A to 3N are cross-sectional views illustrating an example of a method of fabricating a magnetic sensor.
Figure 3B:
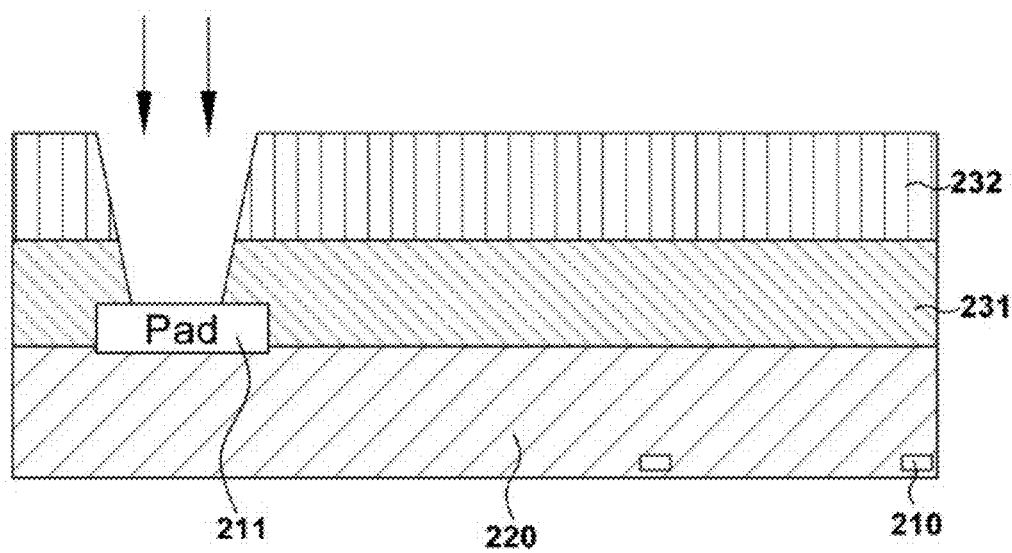
Figure 3C:
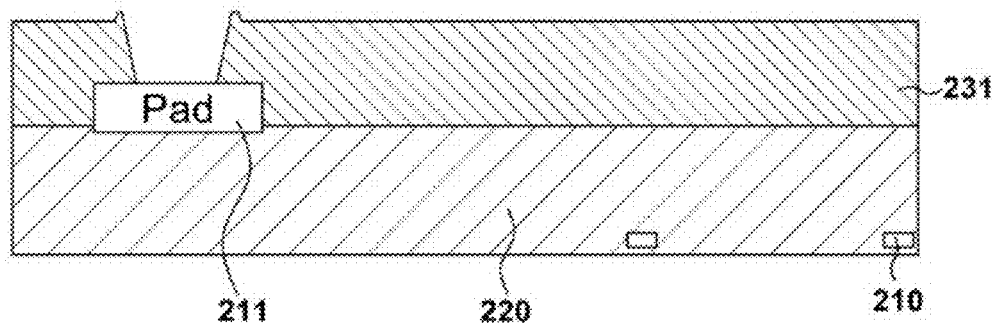
Figure 3D:
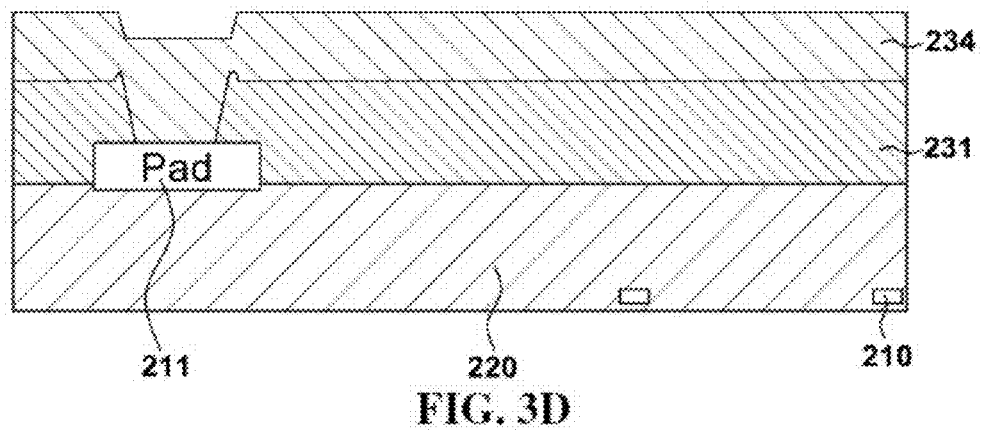
Figure 3E:
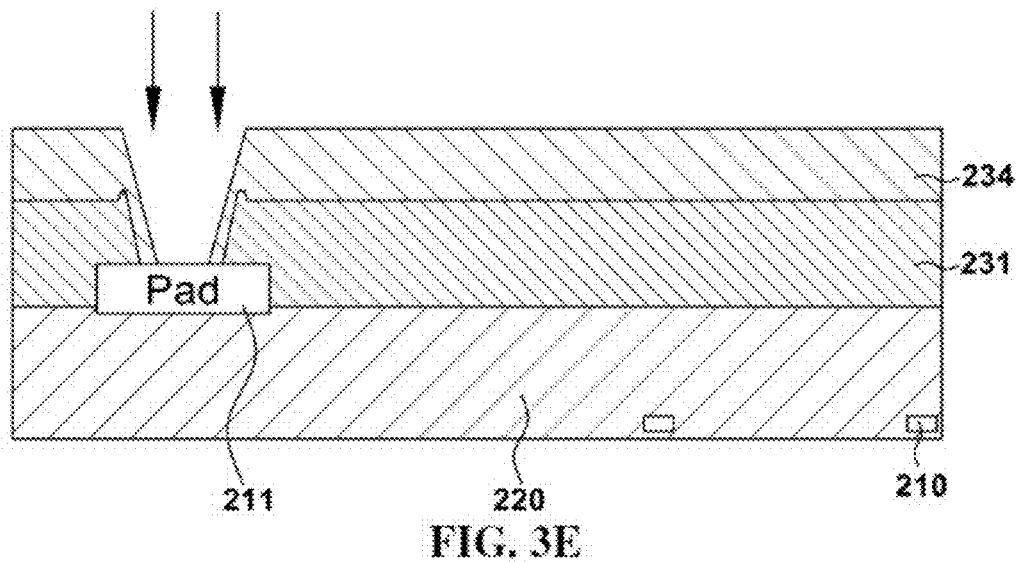
Figure 3F:
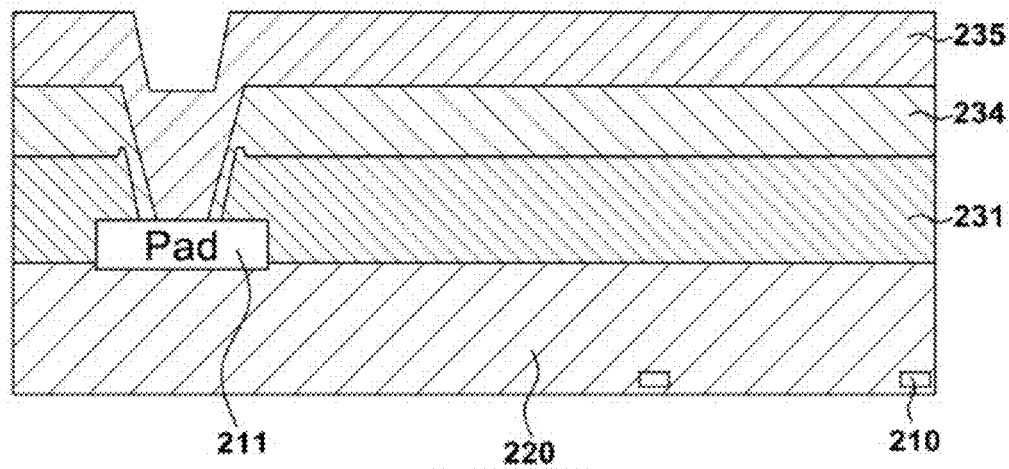
Figure 3G:
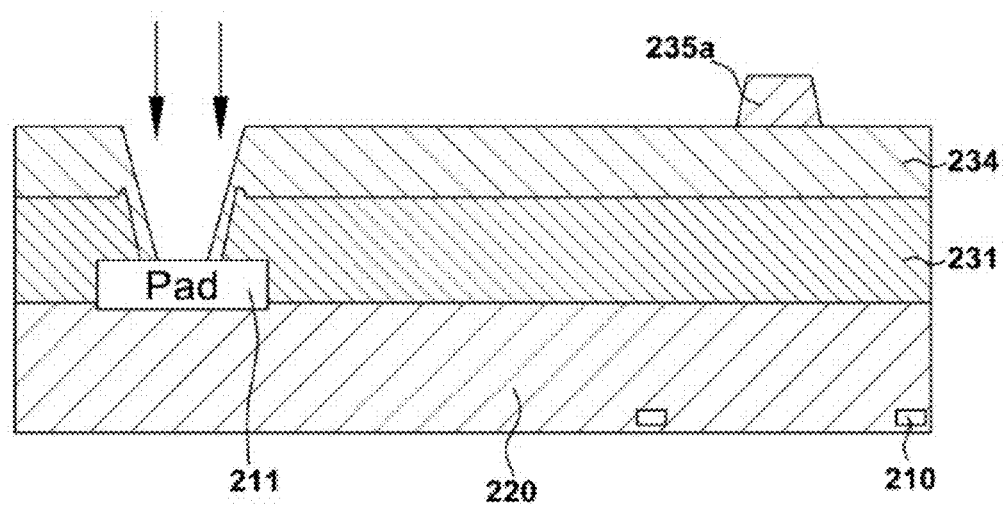
Figure 3H:
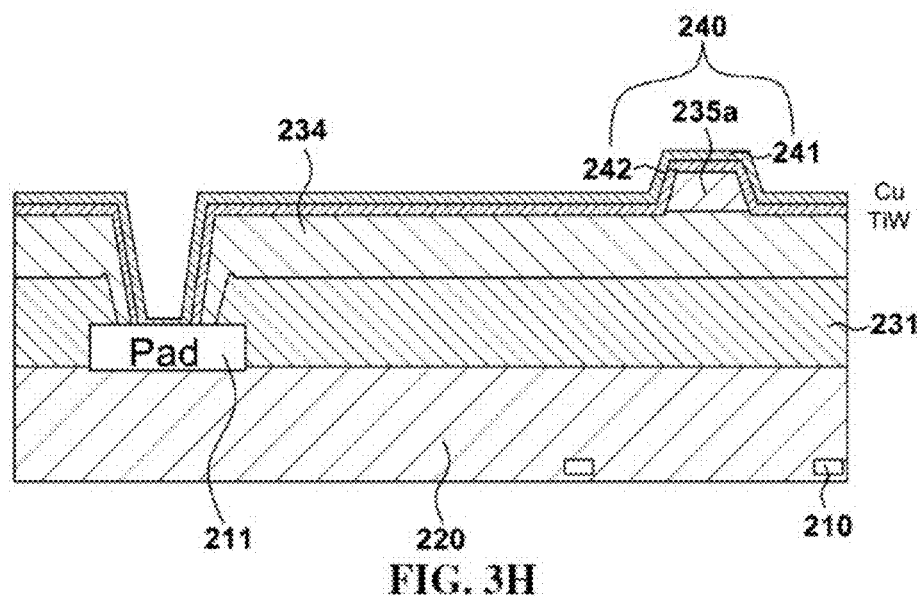
Figure 3I:
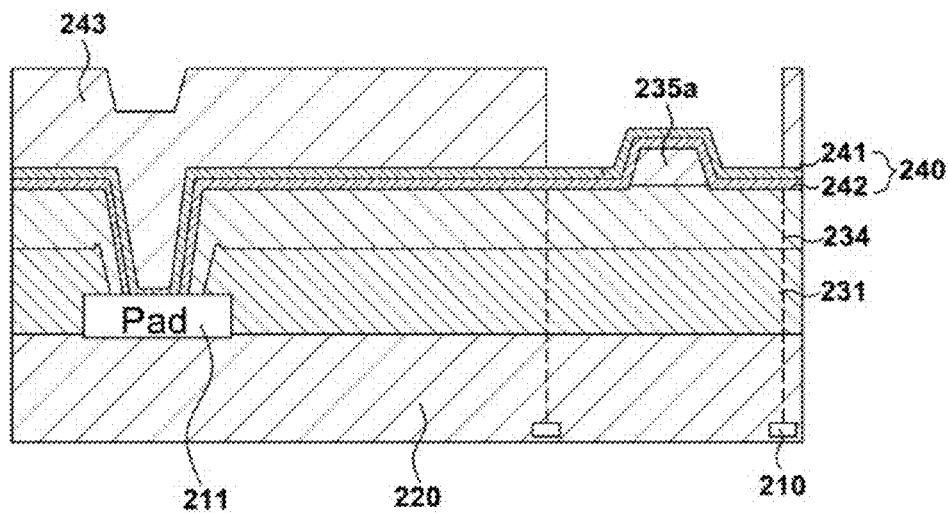
Figure 3J:
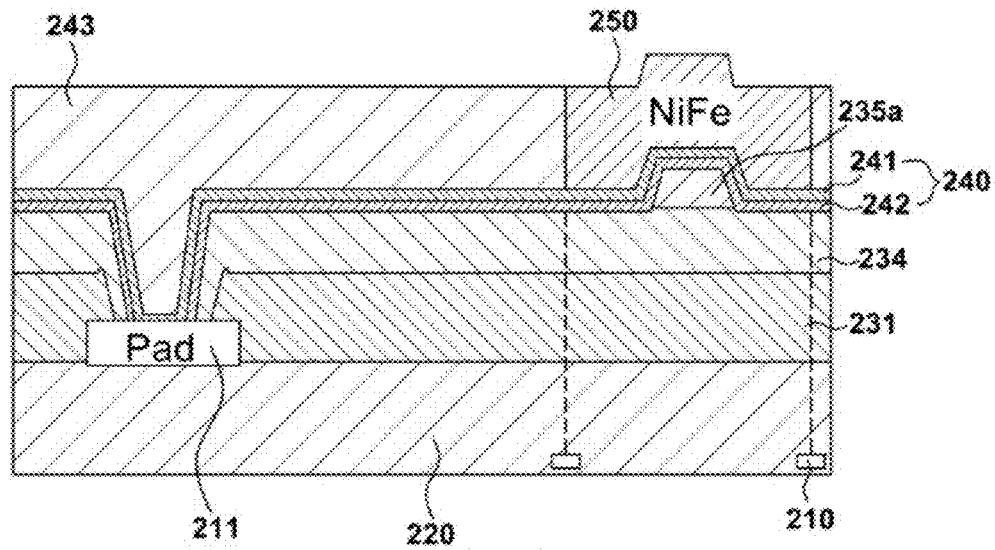
Figure 3K:
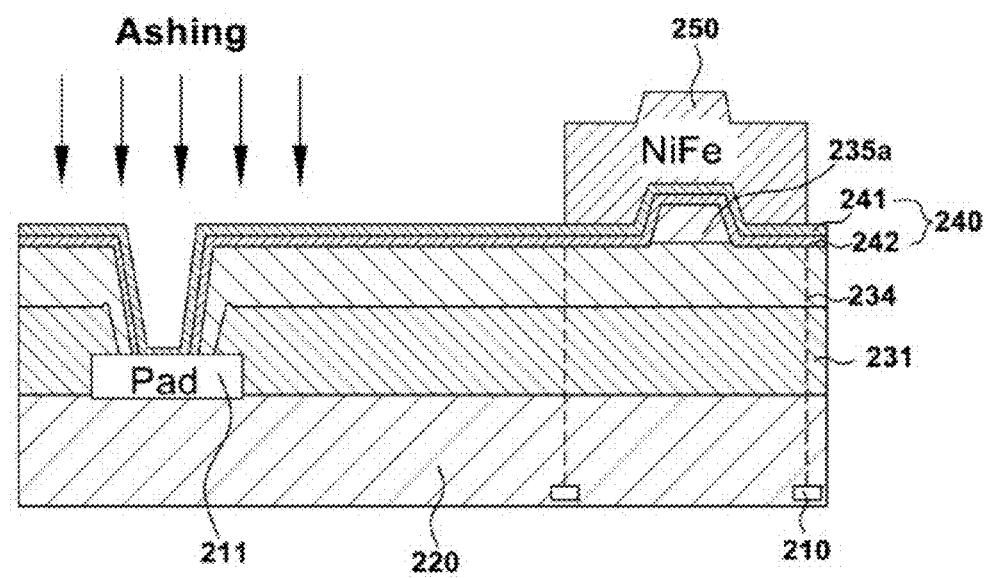
Figure 3L:
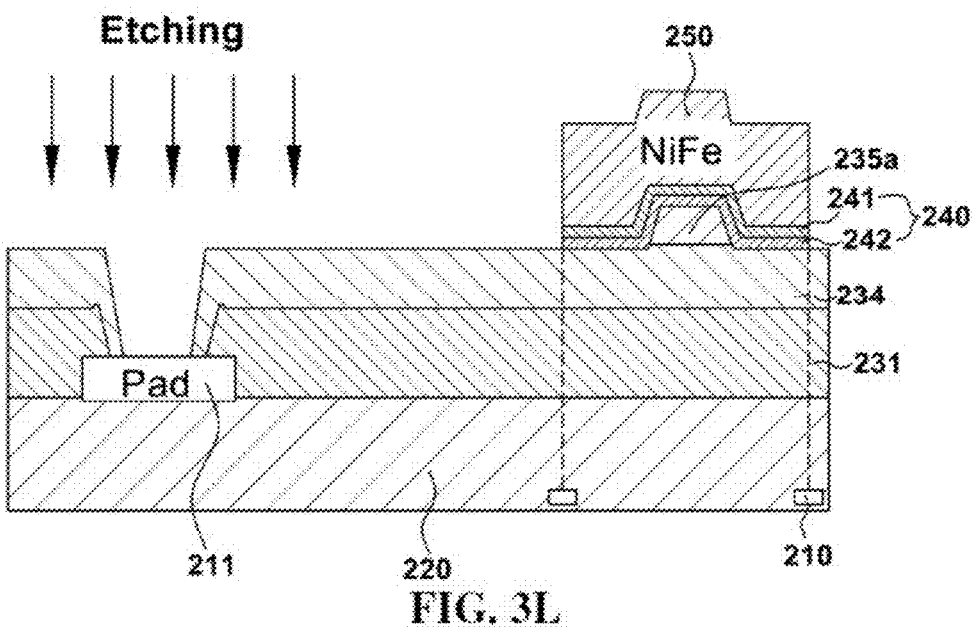
Figure 3M:
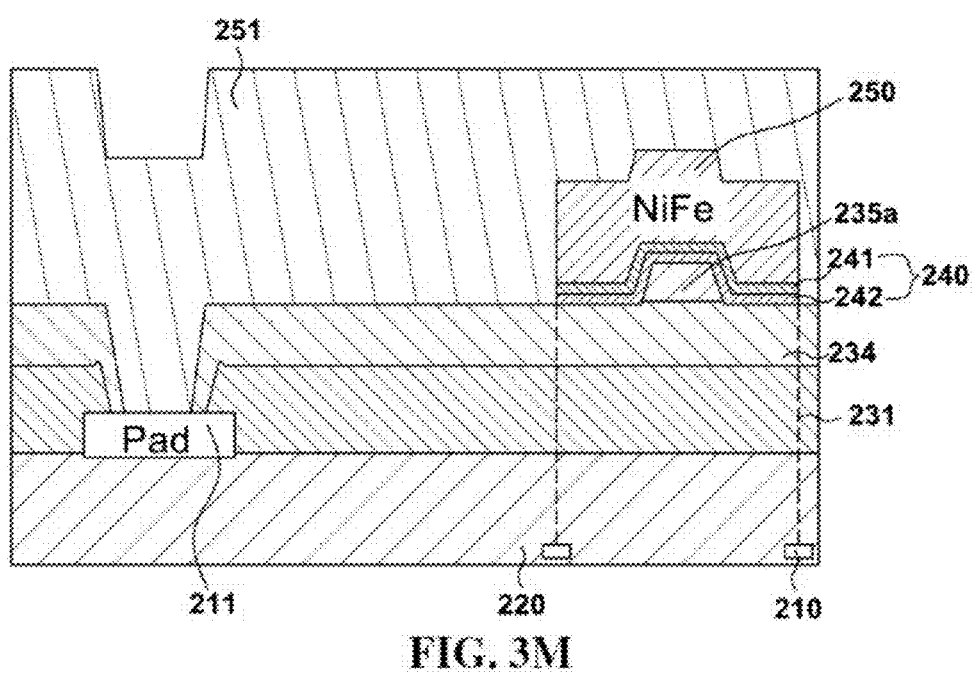
Figure 3N:
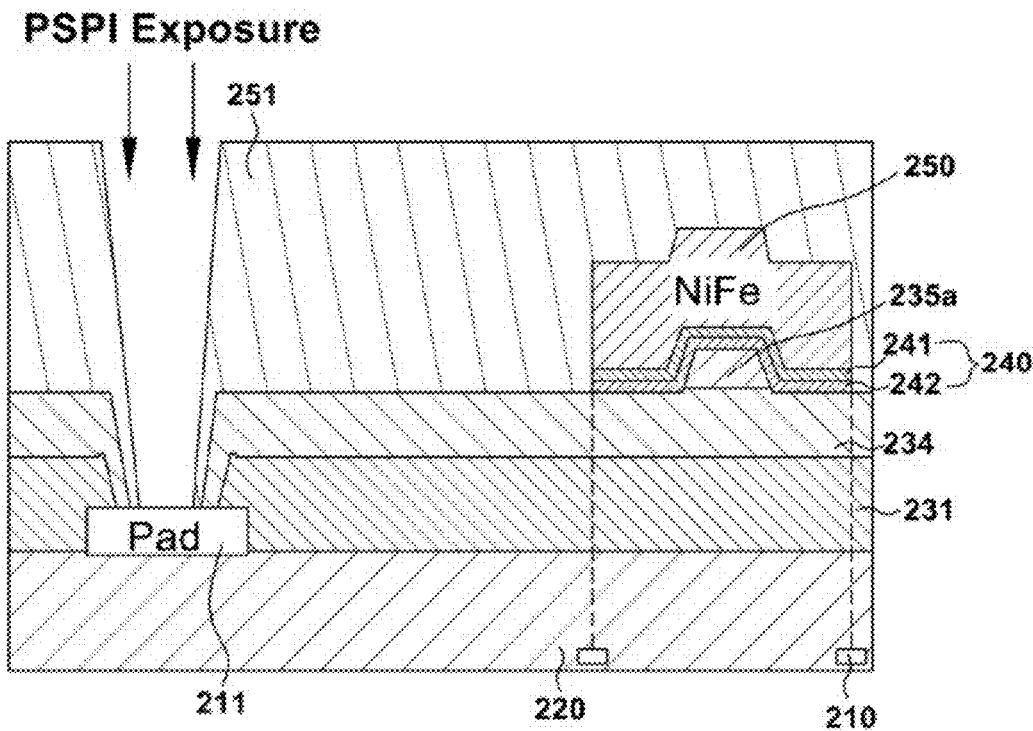

FIGS. 3A to 3N are cross-sectional views illustrating an example of a method of fabricating a magnetic sensor.

An example of a method of fabricating a magnetic sensor according to FIGS. 3A to 3N includes preparing a substrate 220 in which a plurality of hall elements 210 are disposed; forming a protection layer 230 on the substrate 220; forming buffer layers 234 and 235 on the protection layer 230; forming a plurality of protrusions 235a on a surface of the buffer layer 234 by etching the buffer layer 235; forming a seed layer 240 having an uneven surface corresponding to the plurality of protrusions 235a on a surface of the protection layer 230; and forming an IMC 250 having an uneven surface on the seed layer 240. The substrate 220 may be a semiconductor substrate. In an example, the substrate is a semiconductor substrate of a complementary metal-oxide semiconductor (CMOS). The IMC 250 may be formed of a magnetic material using electroplating. The IMC 250 may include an alloy containing two or more components selected from the group consisting of Ni, Fe, Co, and Mn. The magnetic material may have a coefficient of thermal expansion in a range of 5 to 20 ppm/° C. In an example in which the magnetic material includes a NiFe alloy, the Fe content of the magnetic material may be in a range of 10 to 30 atomic %. The seed layer 240 may include a resin and a metal. The cross-section of the uneven surface of the seed layer may include a plurality of concave portions and a plurality of convex portions. The plurality of concave portions and the plurality of convex portions may be arranged regularly or irregularly. A pad 211 may be formed on a surface of one side of the substrate 220, as depicted in FIG. 3A.

An example of a method of fabricating the magnetic sensor will be described in detail with reference to FIGS. 3A to 3N.

First, as illustrated in FIG. 3A, a hall element 210 and a pad 211 are formed on a semiconductor substrate 220. That is, a plurality of hall elements 210 are buried at intervals in the semiconductor substrate 220, or the plurality of hall elements 210 are formed at intervals on the semiconductor substrate 220. The semiconductor substrate 220 may include a silicon (Si) substrate or a gallium arsenic (GaAs) substrate. The hall elements 210 may be formed by implanting P type ions or N type ions into the semiconductor substrate 220. The hall elements 210 may have to sense change in a magnetic force amplified by the magnetic material. Next, a protection layer 231 is formed on the semiconductor substrate 220 in which the hall elements 210 are formed. The protection layer 231 may include a silicon oxide layer and a silicon nitride layer.

Referring to FIG. 3B, a pattern 232 is used to perform an etching process on the protection layer 231 to expose a pad 211. During the etching process, a portion of the protection layer 231 disposed above the pad 211 may be etched to expose the pad 211. The pattern 232 may comprise a photoresist in a shape designed to expose the pad 211.

The pad 211 may be connected to a hall element 210 and may provide a voltage to the hall element 210. Several processes of forming an insulating layer and a metal interconnection between the hall elements 210 and the pad 211 may be performed. The metal interconnection may not have to be deposited on the hall elements 210. It is because, when the metal interconnection is disposed on the hall elements 210, an intensity of a magnetic field amplified by an IMC 250 formed on the hall element 210 is blocked by the interconnection and thus the intensity of the magnetic field affecting the hall element 210 may be reduced.

After the pad 211 is exposed, the pattern 232 is removed as illustrated in FIG. 3C. The pattern 232 may be removed through an ashing process. For example, a plasma ashing process may be used to remove the pattern 232.

Referring to FIG. 3D, photosensitive polyimide (PSPI) is coated over the protection layer 231 to obtain a first buffer layer 234 that covers the exposed pad 211 and the protection layer 231. The first buffer layer 234 may include polyimide. Though the PSPI coating process, a top surface of the pad 211 may be covered with the first buffer layer 234.

As illustrated in FIG. 3E, the pad 211 is again exposed using a first buffer mask (not shown) disposed on the first buffer layer 234. That is, a portion of the first buffer layer 234 formed over the exposed portion of the pad 211 is removed through a PSPI exposure process. The first buffer layer 234 is easily removed through the exposure process. Thereafter, a curing process is performed to harden the remaining first buffer layer 234. The hardened first buffer layer 234 has a property like a thermal oxide layer and thus is not easily removed in a subsequent exposure and etching process.

Referring to FIG. 3F, a PSPI coating process is performed again to form a second buffer layer 235 on the hardened first buffer layer 234 and the pad 211. The second buffer layer 235 may include the same material as the first buffer layer 234. For example, the second buffer layer 235 may include polyimide. During the PSPI coating process, the top portion of the pad 211 is again covered with the second buffer layer 235.

Referring to FIG. 3G, a PSPI exposure process is performed on the second buffer layer 235 using a second buffer mask (not shown) disposed on the second buffer layer 235 to form a protrusion 235a. While the protrusion 235a is formed, the top portion of the pad 211 that was covered by the second buffer layer 235 is again exposed. The second buffer 235 may be removed from the first buffer 234 such that only the protrusions 235a remain on the first buffer 234. After the protrusion 235a is formed, a curing process is performed to harden the protrusion 235a to form a hardened protrusion 235a. A seed layer 240 and an IMC 250 to be formed subsequent to the formation of the protrusion 235a may not have a flat shape, but rather have a protruding shape due to the formation of the protrusion 235a thereunder.

Although one protrusion 235a is depicted in FIG. 3G, a plurality of protrusion 235a may be formed on the first buffer 234. In this example, the protrusion 235a is used to form the uneven surface of an IMC 250. Referring to FIG. 3H, in order to form the seed layer 240 for the IMC 250 that has an uneven surface, the protrusion 235a may be formed to have a rectangular shape in a cross-sectional view or may be formed to have a shape having a positive slope, which a top thereof being narrower than a bottom thereof, in a cross-sectional view. That is, the cross-sectional view of the protrusion 235a may have a tapered trapezoid shape. An upper surface of the seed layer 240 formed thereon may have a protrusion of a similar shape because, when a material for the seed layer 240 such as TiW and Cu is deposited through a physical vapor deposition (PVD) method or a sputtering method, the material for the seed layer 240 may be formed so as to have to a uniform deposition thickness on a surface of the protrusion 235a. On the contrary, when the protrusion 235a has a shape having a negative slope in a cross-sectional view, the seed layer 240 may not be formed to have a uniform deposition thickness. Therefore, in the example illustrated in FIG. 3H, the protrusion 235a has a positive slope.

Referring to FIG. 3H, a TiW layer 242 and a Cu layer 241 are continuously deposited on the first buffer layer 234 on which the protrusion 235a is formed as the seed layer 240 for electroplating. The TiW layer 242 and the Cu layer 241 may be formed through a sputtering method or a vacuum evaporation method. Therefore, in the example depicted in FIG. 3H, the Cu layer 241 is formed on the TiW layer 242. A total thickness of the TiW layer 242 and a Cu layer 241 may be in a range of 200 to 800 nm The seed layer 240 serves to perform an electroplating process on the magnetic material well in a subsequent process. As described above, because the seed layer 240 is formed on the protrusion 235a as to cover the protrusion 235a, the seed layer 240 has an uneven surface in a cross-sectional view.

Referring to FIG. 3I, a pattern mask 243 for forming the IMC 250 is first formed through photolithography. The IMC 250 may include a magnetic material. Hereinafter, the magnetic material from which the IMC 250 is formed is referred to as the magnetic material 250.

As illustrated in FIG. 3J, a NiFe alloy is deposited on the seed layer 240 through electroplating using the pattern mask 243. The NiFe alloy forms the magnetic material 250. The magnetic material 250 deposited on the seed layer 240 may have an uneven surface that corresponds to the protrusion 235a.

Referring to FIG. 3K, after the electroplating is completed, the pattern mask 243 is removed and only the magnetic material 250 remains on the seed layer 240.

Referring to FIG. 3L, the seed layer 240 including the Cu layer 241 and the TiW layer 242 disposed on the pad 211 is removed through a wet etching process. As a result, the seed layer 240 remains only below the magnetic material 250, and the remaining portion of the seed layer 240 is removed as to expose the first buffer 234 and the pad 211. The magnetic material 250 is formed on the hardened protrusion 235a. Thus, the magnetic material 250 is formed with an uneven upper surface. Due to the uneven surface of the magnetic material 250, stress imposed on the substrate 220 may be reduced and an offset voltage may be reduced.

Referring to FIG. 3M, a third buffer layer 251 is formed on the seed layer 240 so as to cover the magnetic material 250 through a PSPI coating process. In this example, the third buffer layer 251 may include polyimide.

Referring to FIG. 3N, a PSPI exposure and curing process is formed on the third buffer layer 251 using a third buffer mask (not shown) disposed on the third buffer later 251 to exposure a top portion of the pad 211. The example of the magnetic sensor 200 is completed with the curing process.

Figure 4A:
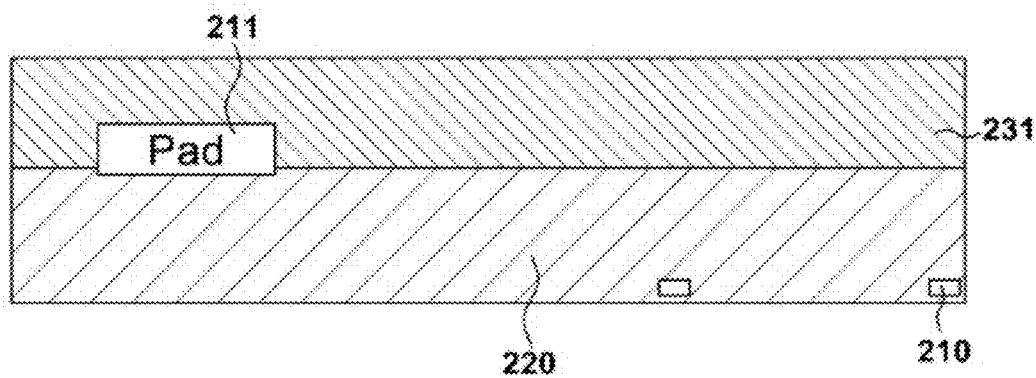
FIGS. 4A to 4O are cross-sectional views illustrating another example of a method of fabricating a magnetic sensor.
Figure 4B:
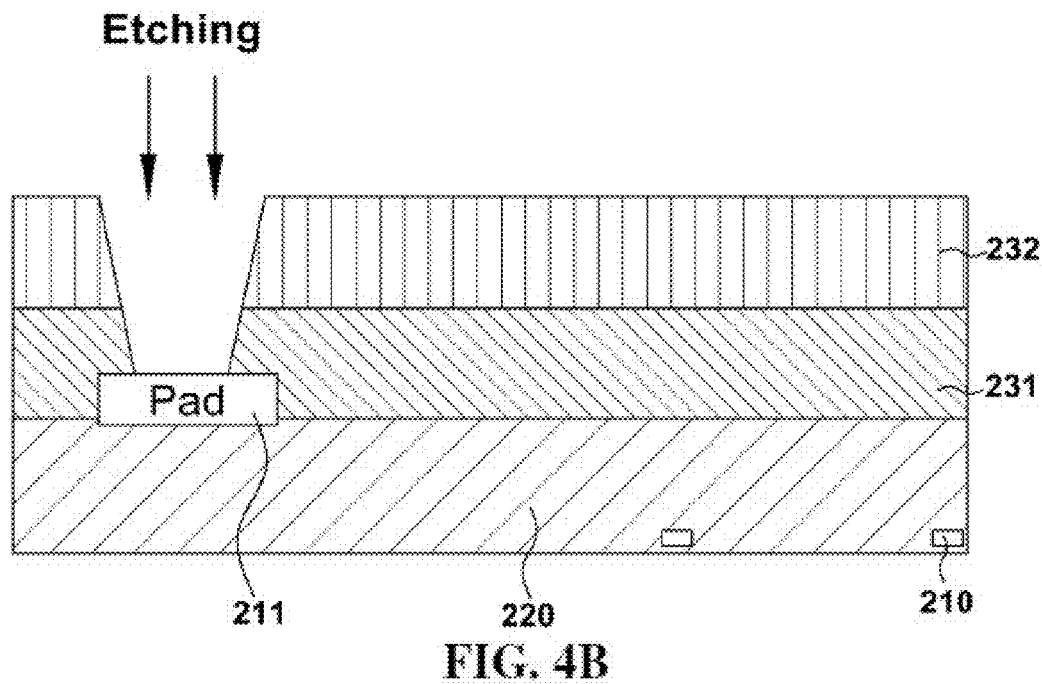
Figure 4C:
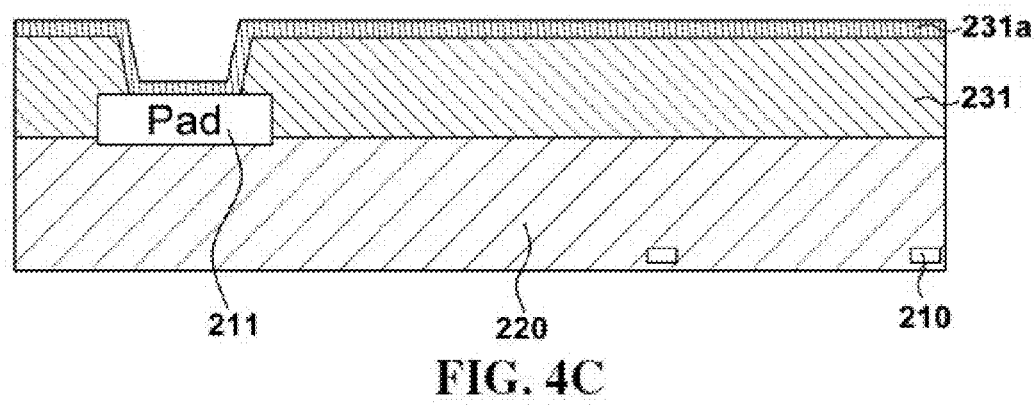
Figure 4D:
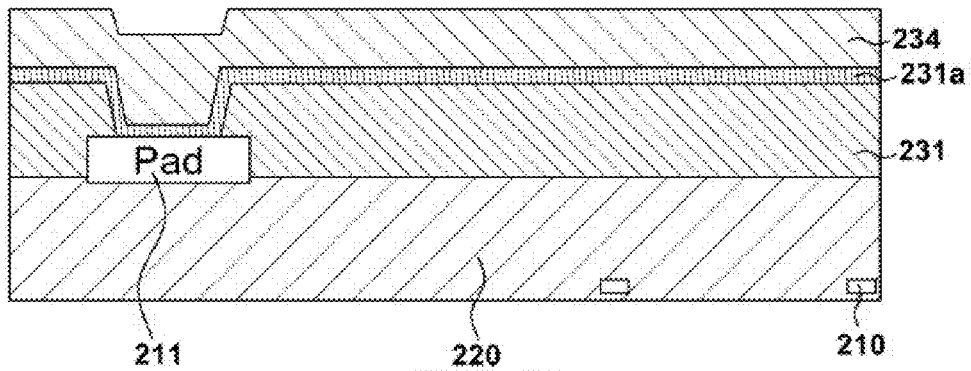
Figure 4E:
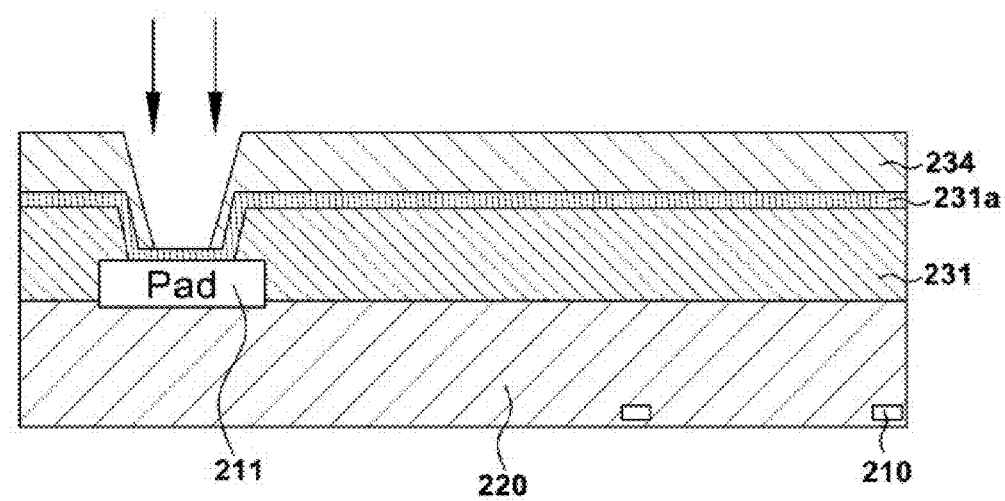
Figure 4F:
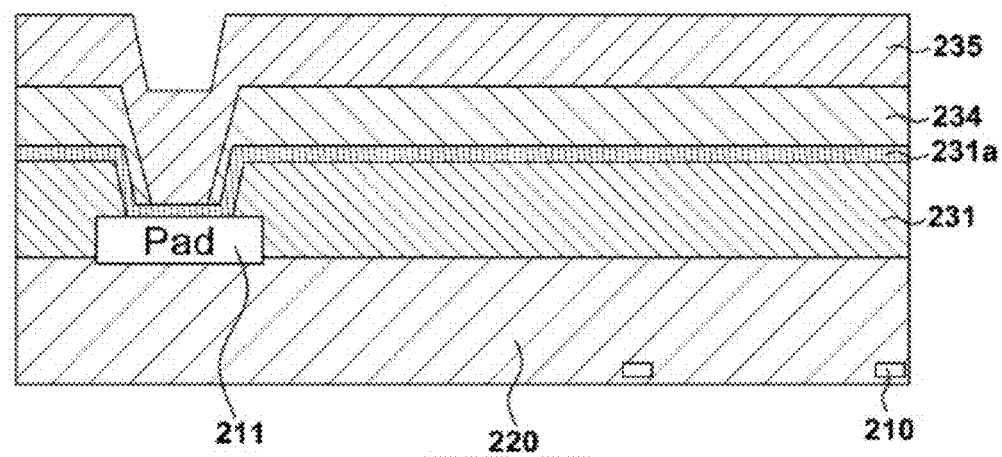
Figure 4G:
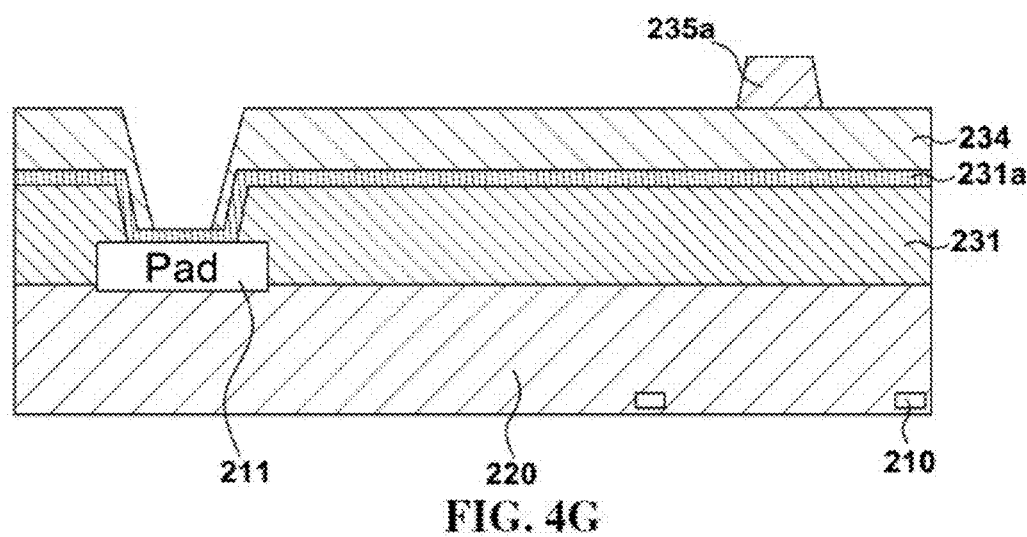
Figure 4H:
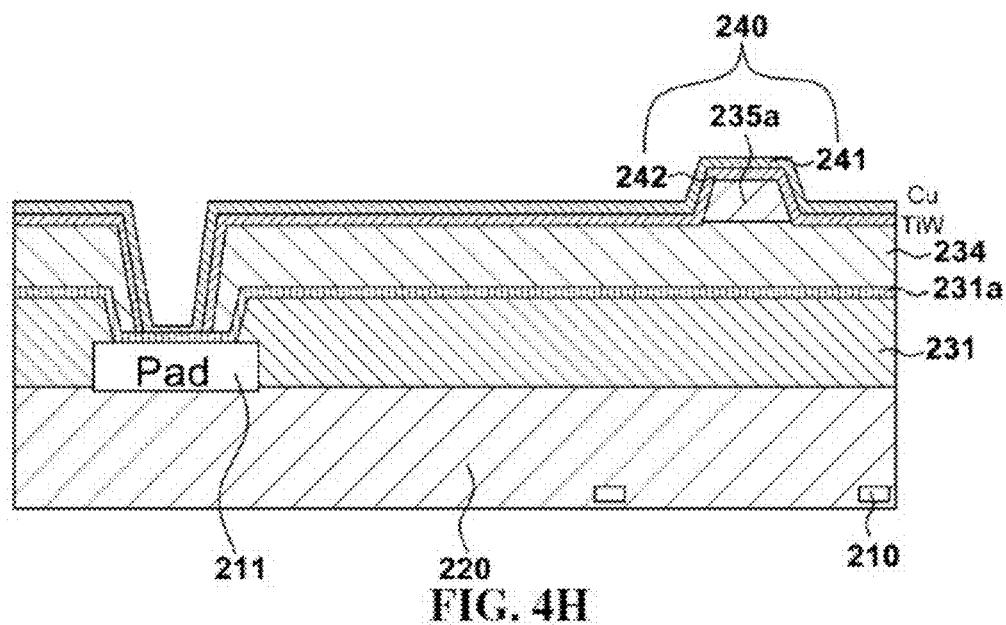
Figure 4I:
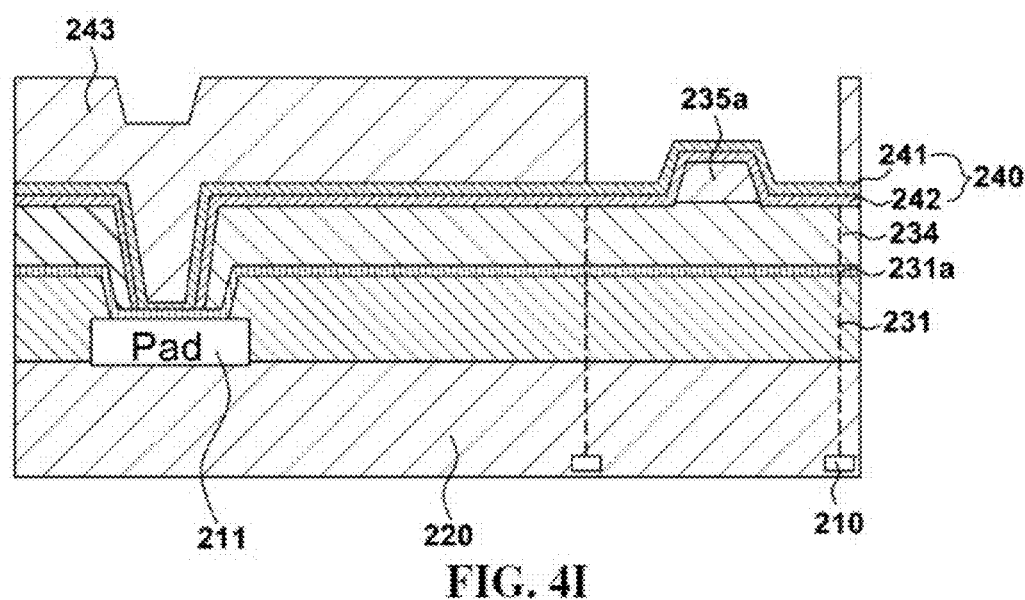
Figure 4J:
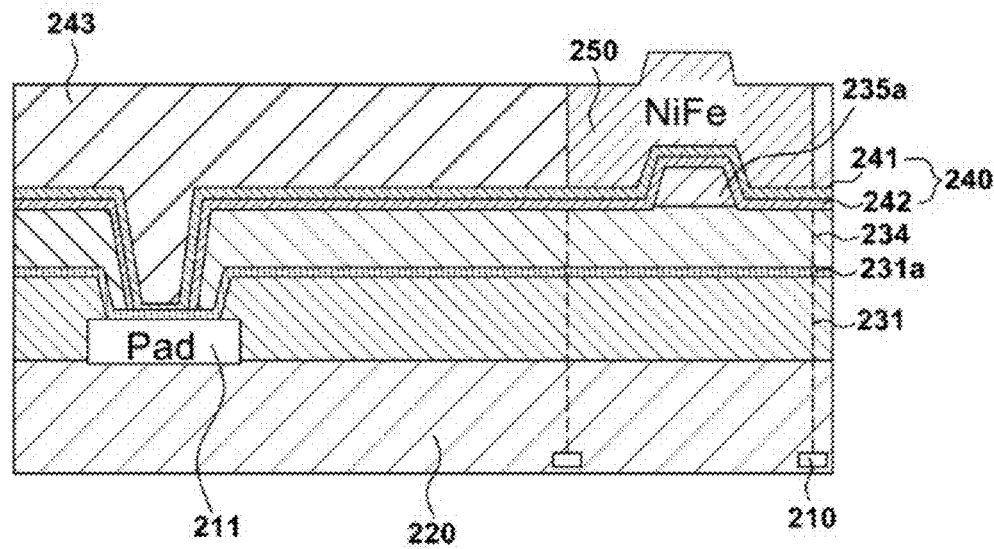
Figure 4K:
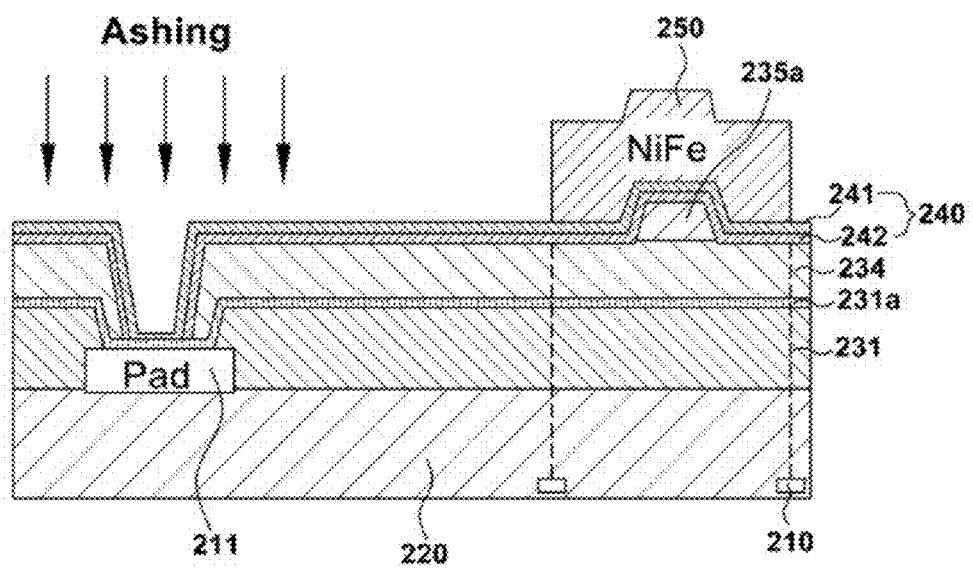
Figure 4L:
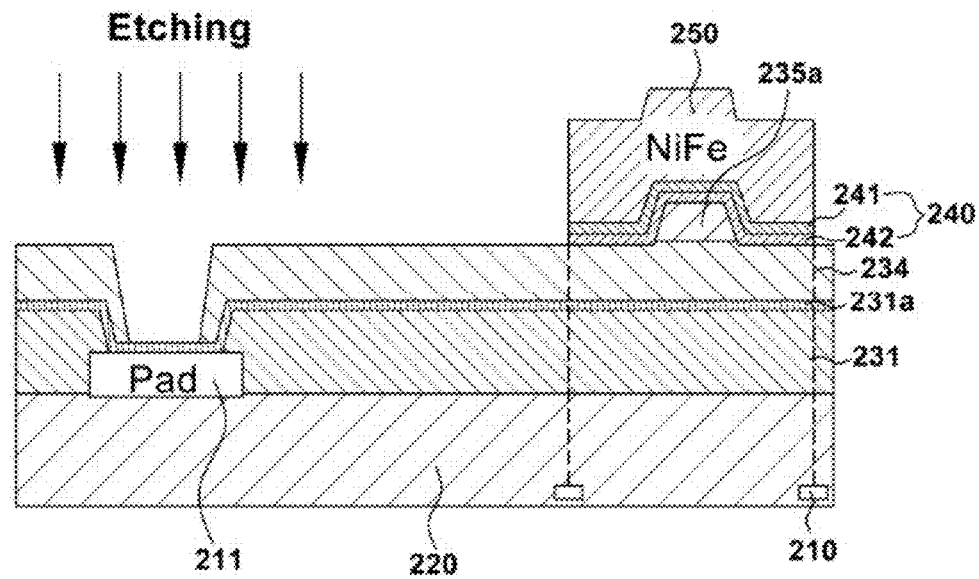
Figure 4M:
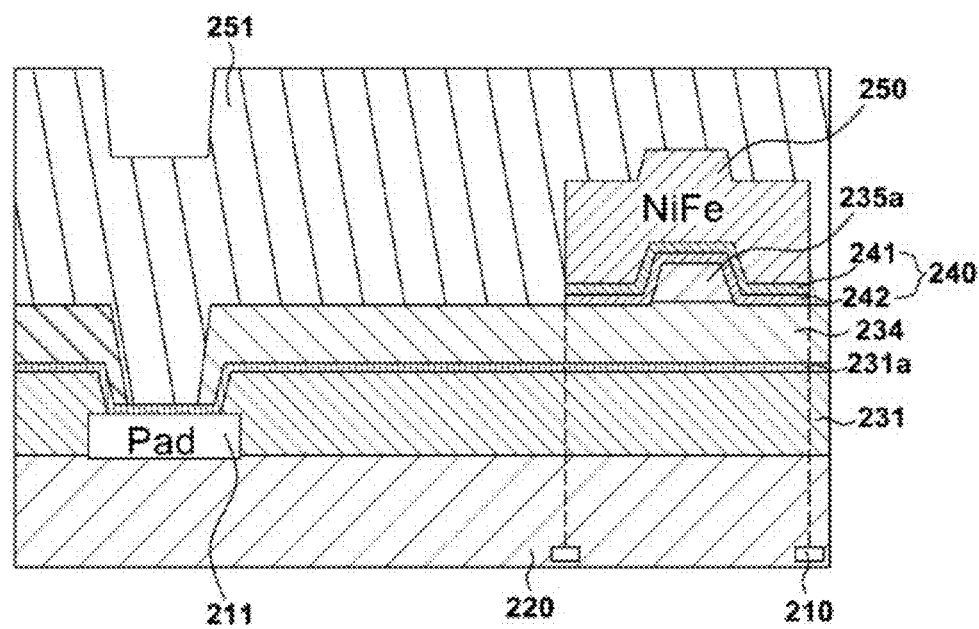
Figure 4N:
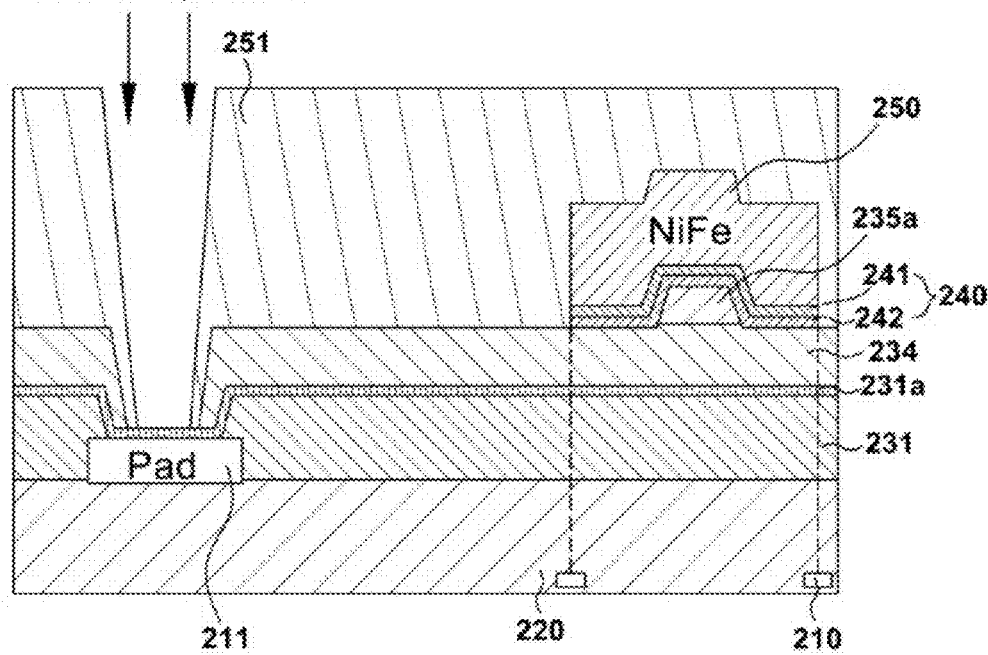
Figure 4O:
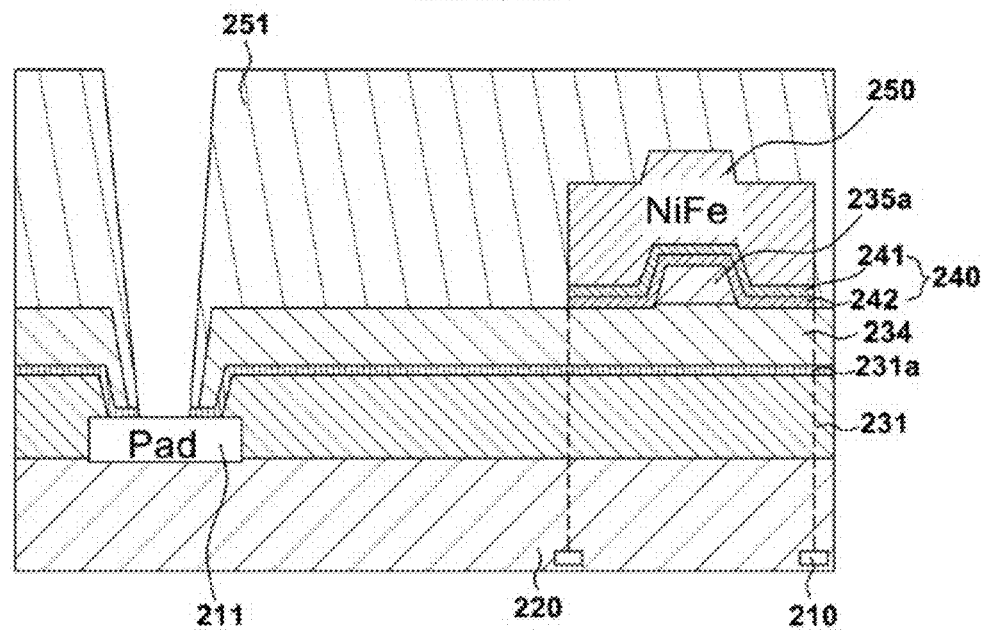

FIGS. 4A to 4O are cross-sectional views illustrating another example of a method of fabricating a magnetic sensor.

Referring to FIGS. 4A to 4O, various steps performed in the example of a fabrication method of a magnetic sensor illustrated are substantially the same as those performed in the example of fabrication method as illustrated in FIGS. 3A to 3N. Thus, detailed description thereof will be omitted.

For example, the steps performed in FIGS. 4A and 4B are substantially the same as the steps performed in FIGS. 3A and 3B, and the detailed description thereof will be omitted. The example of the method of fabricating a magnetic sensor according FIGS. 4A to 4O, however, further include forming a corrosion barrier layer to prevent a pad from being corroded. Referring to FIG. 4C, a pad 211 is provided on a surface of a semiconductor substrate 220 on one side thereof, and then an insulating layer is further deposited on the pad 211 and protection layer 231 to form a corrosion barrier layer 231a. In this example, the corrosion barrier layer 231a may include an oxide-based or nitride-based insulating layer and may be deposited through a plasma-enhanced chemical vapor deposition (PECVD) method. When the corrosion barrier layer 231a is formed through a PECVD method, the corrosion barrier layer 231a may include a silicon oxide layer using a tetra ethyl ortho silicate (TEOS) material. For this example, the thickness of the corrosion barrier layer 231a may be in a range of 5 to 50 nm The thickness may be 40 nm or less because it may be difficult to etch the insulating layer for the corrosion barrier layer to expose the pad 211 when the thickness of the corrosion barrier layer is more than 50 nm. On the other hand, when the insulating layer has a thickness of less than 5 nm, the insulating layer may be too is very thin and may not serve as a protection layer. The numerical limit values for the thickness are the desirable value obtained using resultant values obtained through repeated experiments, and may be associated with certain characteristics and effects for the manufactured magnetic sensor 200.

Referring to FIG. 4D, a first buffer layer 234 is deposited on the corrosion barrier layer 231a through a PSPI coating process. The corrosion barrier layer 231a is disposed between the protection layer 231 and the first buffer layer 234. Referring to FIGS. 4E and 4G, repeated PSPI exposure and developing processes are performed on the first buffer layer 234 and a second buffer layer 235. During the PSPI exposure and developing processes, the top surface of the pad 211 is covered with the corrosion barrier layer 231a. Thus, the top of the pad 211 may be prevented to be corroded from a tetra methyl ammonium hydroxide (TMAH) solution that is one of developing solutions used in the PSPI exposure and developing processes of the first and second buffer layers.

Referring to FIG. 4H, a seed layer 240 including a Cu layer 241 and a TiW layer 242 is formed on the corrosion barrier layer 231a and the first buffer layer 234 having formed thereon a protrusion 235a.

Referring to FIGS. 4I-4K, a magnetic material 250 is formed on the seed layer 240 in processes substantially similar to FIG. 3I-3K.

Referring to FIG. 4L, a portion of the seed layer 240 is removed through etching. As illustrated in FIG. 4L, because the corrosion barrier layer 231a is formed on the pad 211, the pad is prevented from being etched even when the seed layer 240 is etched. Referring to FIG. 4N, after the third buffer layer 251 is formed in FIG. 4M, because the top portion of the pad 211 is protected by the corrosion barrier layer 231a, the corrosion of the pad 211 may be prevented during the exposure and developing processes of the third buffer layer 251.

Referring to FIG. 4O, the corrosion barrier layer 231a that is formed as described above is removed after the PSPI exposure and the curing process is performed on the third buffer layer 251 using a third buffer mask (not shown) disposed on the third buffer layer 251. Therefore, the top portion of the pad 211 is finally opened through a process of removing the corrosion barrier layer 231a.

Thus, referring to the example illustrated in FIGS. 4A-4O, the top portion of the pad 211 may be protected from corrosion caused by a TMAH solution that is used as one of developing solutions during the repeated PSPI exposure and developing processes. The corrosion barrier layer 231a is removed from the top of the pad after the repeated PSPI exposure and developing processes are performed. The corrosion barrier layer 231a may preferably include a material such as a silicon oxide layer that can be chemically endured from a solution such as a TMAH solution. When the top of the pad is corroded, an electrical contact failure may be caused; thus, the prevention of the corrosion is desirable.

Figure 5B:
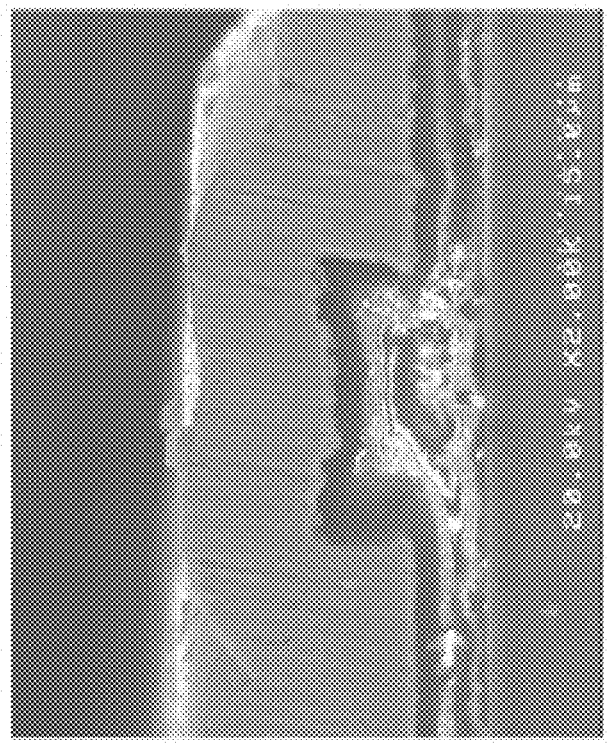
FIGS. 5A and 5B are views illustrating scanning electron microscope (SEM) photographs of an example of an IMC of a magnetic sensor respectively from the top and a cross-sectional view of the IMC.
Figure 5A:
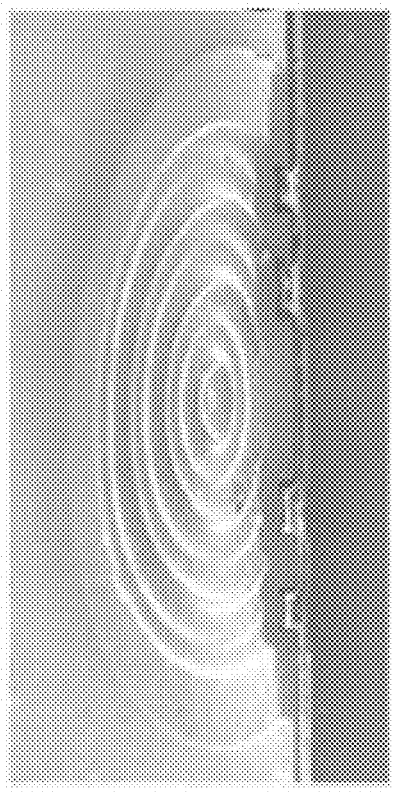

FIG. 5 illustrates scanning electron microscope (SEM) photographs for a perspective view from the top and a cross-sectional view of the uneven surface of an IMC 250 of the magnetic sensor 200 fabricated according to the above-described examples.

The SEM photograph (A) of FIG. 5 depicts a perspective view from the top of the uneven surface of the IMC 250, and the SEM photograph (B) of FIG. 5 depicts a cross-sectional view of the IMC 250 having the uneven surface through a protrusion 235a formed on the first buffer layer 234 as a magnified view of the SEM photograph (A). As illustrated in the SEM photograph (A), the example of magnetic sensor includes protrusions in the shape of two concentric circles, which form corresponding unevenness on the upper surface of the IMC 250.

Figure 6A:
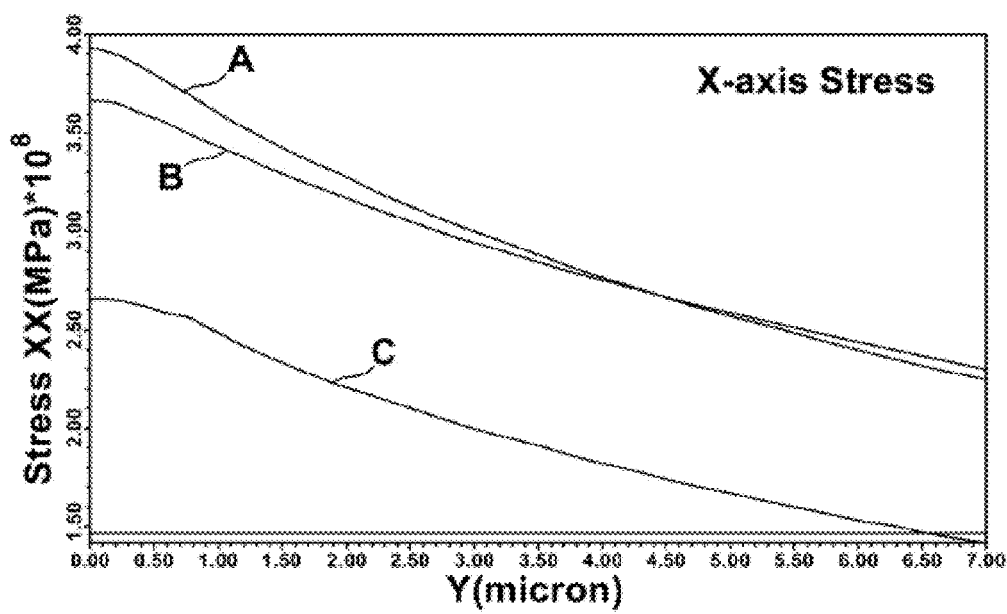
FIG. 6A and 6B are graphs illustrating stress in an X-axis direction and stress in a Y-axis direction that affect a hall element of an example of a magnetic sensor.
Figure 6B:
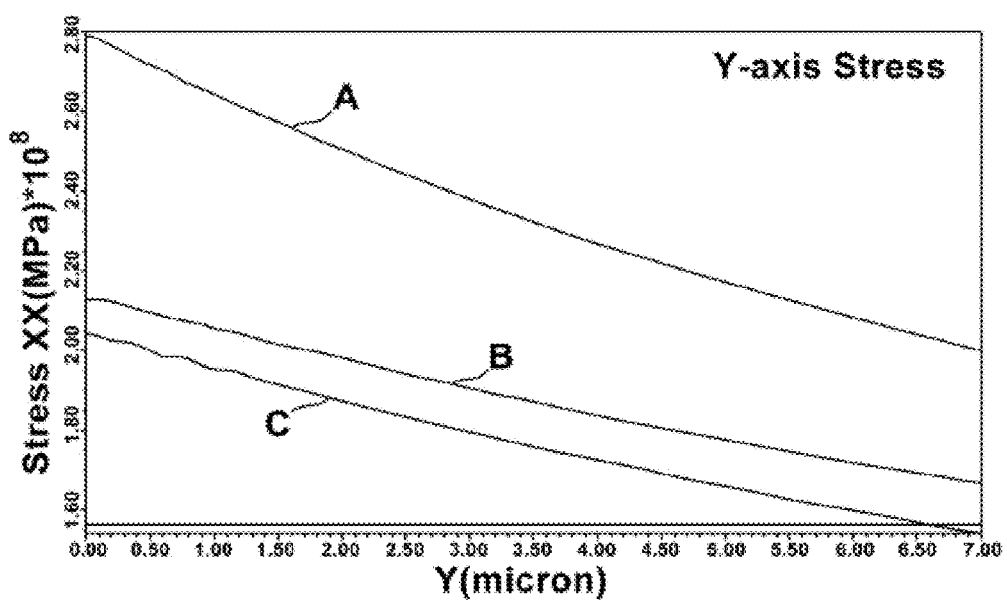
Figure 7A:
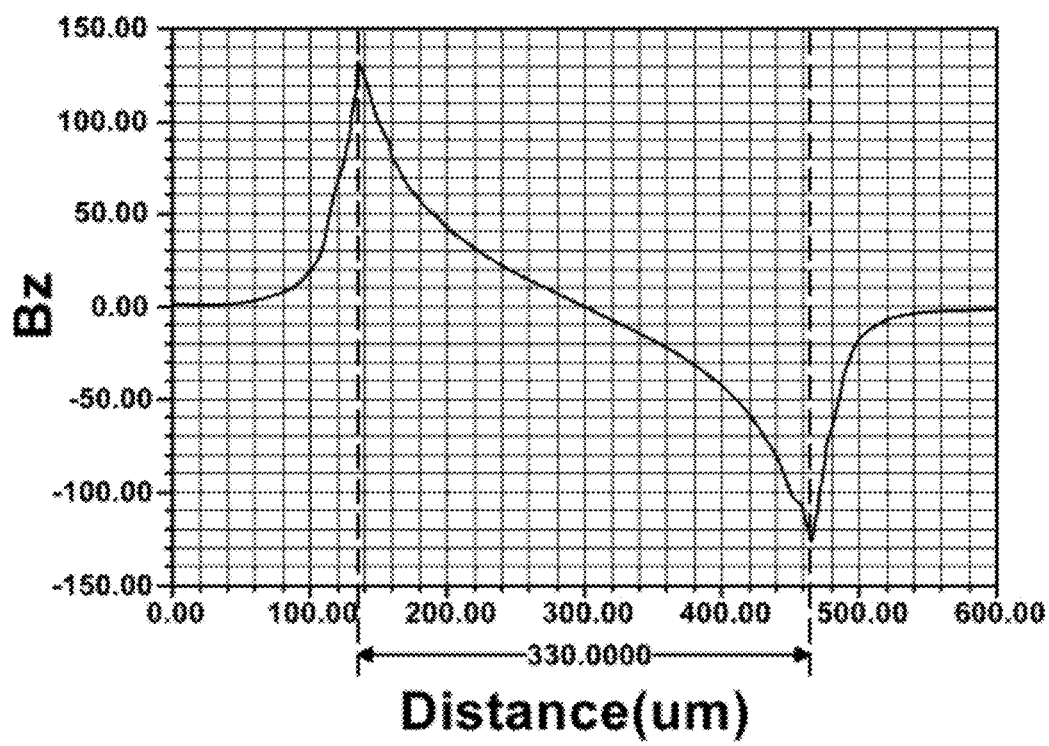
FIG. 7A and 7B are a graph illustrating a magnetic flux simulation result of an example of an IMC.
Figure 7B:
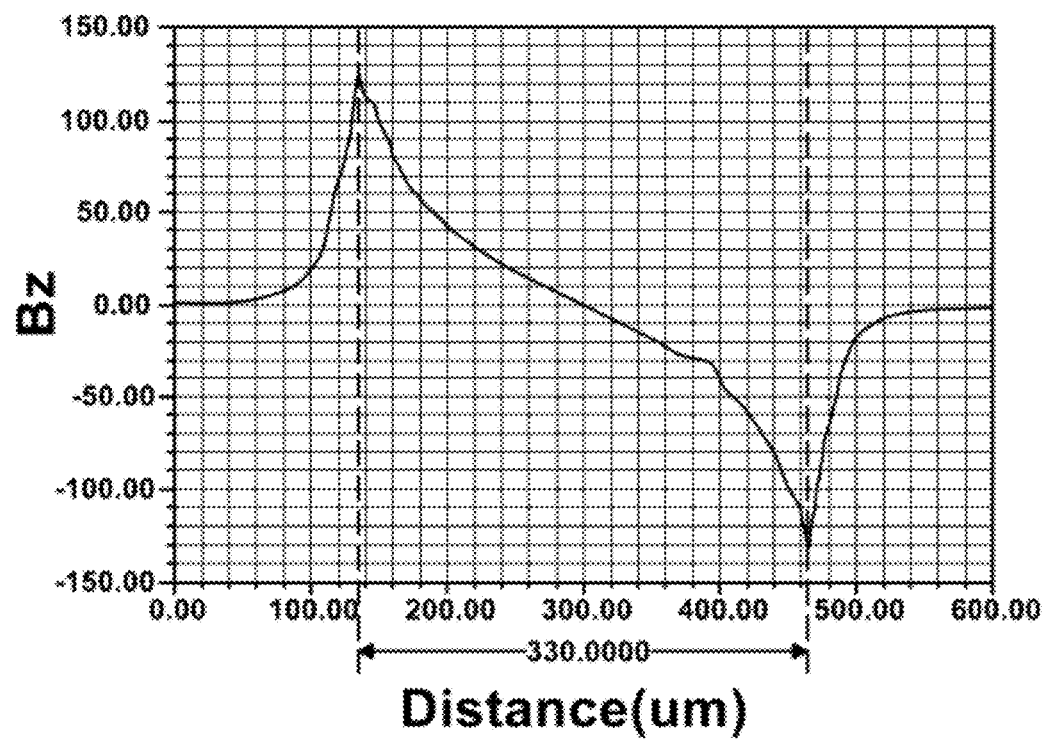

FIGS. 6A and 6B are graphs showing stress in an X-axis direction and a Y-axis direction affecting a hall element, and FIGS. 7A and 7B are graphs showing a simulation result of a magnetic flux of the IMC.

As described above, the hall element 210 configured to sense a magnetic field is disposed below the IMC 250, and the protrusion 235a reduces or minimizes the stress affecting characteristics of the magnetic sensor 200 around the hall element 210. In general, most of the stress is applied to edge portions B of the IMC 250. It can be seen from the simulation that the stress affects the hall element 210 and the result is illustrated in FIGS. 6A and 6B.

For instance, FIG. 6A shows the stress in the X-axis direction of the IMC according to a depth of a hall element, and FIG. 6B shows the stress in the Y-axis direction of the IMC 250. Here, the stress refers to pressure or compressive stress or tensile stress affecting the substrate in which the hall element is formed. Multi-layered insulating layers are interposed between the IMC and the hall element. The stress is applied to the insulating layers according to the shape of the IMC and the stress is transferred to the hall element again through the insulating layers. According to an example of the present disclosure, because the IMC has a thin thickness of 5 to 20 μm and a very large width of 200 to 400 μm, the stress may largely affect the insulating layers and the hall elements disposed below the IMC.

It can be seen from FIGS. 6A and 6B that the IMC having the uneven surface has the lowest stress in the X-axis direction and the Y-axis direction indicated by "C" as compared with the IMCs having a flat surface in the related art indicated by "A" and "B". The offset characteristic may be improved and sensibility may be increased through the improved stress effect. A plurality of uneven shapes is more effective in improving the stress than one uneven shape. For example, as described in FIG. 2A, the uneven shape of the IMC 250 may be formed by electroplating a magnetic material for the IMC on the protrusion 235a having a width of 5 to 30 μm and a height of 1 to 10 μm and the seed layer 240 as described in FIG. 2A.

In order to check whether the IMC 250 having the uneven surface that is described above to improve the stress performs a function of vertically concentrating a magnetic field, a simulation was performed with a magnetic field.

FIGS. 7A and 7B illustrate a simulation result of a magnetic flux. It can be seen that a value (Bz shown in FIG. 7B) of a vertical component of the magnetic field in which the IMC having the uneven surface is similar to a value (Bz shown in FIG. 7A) of a vertical component of the magnetic field in which the IMC having the flat surface in the related art affects the hall element.

Various examples of magnetic sensors and methods of fabricating the same are described above. According to an example, a fabrication process of producing an IMC having an uneven shape and improved sensor characteristics is described. The IMC may exhibit improved sensor characteristics due to a uniform reduction in stress of the hall elements.

In an example, a magnetic sensor includes: a semiconductor substrate in which a plurality of hall elements are disposed; a protection layer formed on a semiconductor substrate; a seed layer formed on the protection layer; and an integrated magnetic concentrator (IMC) formed on the seed layer. Each of the seed layer and the IMC may have an uneven surface. An area of the IMC may be equal to or larger than that of the seed layer.

The protection layer may include a plurality of protrusions (or elevations) formed on a surface thereof. Each of the uneven surfaces of the seed layer and the IMC may have a cross-section in which a plurality of concave portions and plurality of convex portions are regularly or irregularly arranged. The hall elements may be disposed so as to overlap edge portions of the IMC in a vertical direction of the magnetic sensor. The protection layer may include a passivation insulating layer and a buffer layer, and the protection layer may further include a corrosion barrier layer.

The corrosion barrier layer may include any one of a silicon oxide layer and a silicon nitride layer. The corrosion barrier layer may have a thickness of 5 to 50 nm. The corrosion barrier layer may be interposed between the passivation insulating layer and the buffer layer and the protrusions may include polyimide.

When the IMC includes a nickel-iron (NiFe) alloy, the IMC may have a composition in which a content of Fe is 10 to 30 atomic %.

The seed layer may include a titanium tungsten (TiW) material and a copper (Cu) material.

In an example, a method of fabricating a magnetic sensor includes: preparing a substrate in which a plurality of hall elements are disposed; forming a protection layer on the substrate; forming a buffer layer on the protection layer; forming a plurality of protrusions on a surface of the buffer layer; forming a seed layer having an uneven surface corresponding to the plurality of protrusions; and forming an integrated magnetic concentrator (IMC) having an uneven surface on the seed layer. The uneven surface of the seed layer or the IMC may have a cross-section in which a plurality of concave portions and a plurality of convex portions are regularly or irregularly arranged.

The seed layer may include double layers of a titanium tungsten (TiW) material and a copper (Cu) material. The method may further include forming a corrosion barrier layer.

The corrosion barrier layer may include any one of a silicon oxide layer and a silicon nitride layer. The corrosion barrier layer may be formed between the protection layer and the buffer layer. The protrusions may include polyimide.

In an example of fabricating a magnetic sensor having the above-described configuration, the fabrication process may be simplified by forming an IMC having an uneven surface without using an accurate etching process for horizontally etching the seed layer. Further, the stress of the hall element may be reduced to constant uniformity and sensor characteristics may be improved through formation of the regularly uneven shape of the IMC.

The foregoing examples are provided for illustrative purposes, and are not to be construed as limiting the present disclosure. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

In the claims, means-plus-function clauses are intended to cover the structures described herein as performing the recited function, and not only structural equivalents but also equivalent structures.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a magnetic sensor, the method comprising:
    forming hall elements;
    forming a protection layer comprising a thin portion having a first thickness and comprising a thick portion having a second thickness that forms a protrusion that protrudes upward from an upper surface of the protection layer;
    forming a seed layer disposed above the hall elements; and
    forming an integrated magnetic concentrator (IMC) disposed above the hall elements and the seed layer, the IMC comprising an elevated portion protruding upward from an upper surface of the IMC, and the elevated portion overlapping with the protrusion of the protection layer.

2. The method of claim 1, wherein the seed layer or the IMC has a cross-section in which concave portions and convex portions are arranged.

3. The method of claim 1, wherein the seed layer comprises a titanium tungsten (TiW) layer and a copper (Cu) layer.

4. The method of claim 1, wherein the protection layer comprises a corrosion barrier layer.

5. The method of claim 4, wherein the corrosion barrier layer comprises a silicon oxide layer or a silicon nitride layer.

6. The method of claim 1, wherein the protrusion comprises polyimide.

7. The method of claim 1, wherein the protrusion is in contact with the seed layer.

8. The method of claim 1, wherein the protrusion is formed to generate an uneven surface of the IMC and reduce incident stress on at least one hall element.

9. A method of fabricating a magnetic sensor, the method comprising:
    a protection layer above a substrate in which hall elements are disposed;
    forming a buffer layer above the protection layer comprising thin portions having first thicknesses and comprising thick portions having second thicknesses that are thicker than the thin portions that form protrusions above a top surface of the buffer layer;
    forming a seed layer having an uneven surface corresponding to the protrusions with an elevated portion that protrudes from an upper surface of the seed layer in a substantially normal direction to an upper surface of the substrate; and
    forming an integrated magnetic concentrator (IMC) having an uneven surface above the seed layer and comprising an elevated portion that protrudes from an upper surface of the IMC in the direction substantially normal to the upper surface of the substrate.

10. The method of claim 9, wherein the uneven surface of the seed layer or the uneven surface of the IMC has a cross-section in which concave portions and convex portions are arranged.

11. The method of claim 9, wherein the seed layer comprises a titanium tungsten (TiW) layer and a copper (Cu) layer.

12. The method of claim 9, wherein the protection layer comprises a corrosion barrier layer.

13. The method of claim 12, wherein the corrosion barrier layer comprises a silicon oxide layer or a silicon nitride layer.

14. The method of claim 9, wherein the protrusions comprise polyimide.

15. A method of fabricating a magnetic sensor, the method comprising:
    forming hall elements;
    forming a seed layer disposed above the hall elements; and forming an integrated magnetic concentrator (IMC) disposed above the hall elements, the IMC comprising an elevated portion protruding upward from an upper surface of the IMC, wherein the hall elements are disposed such that a peripheral edge of the IMC overlaps with a width of the hall elements, and wherein the seed layer overlaps the hall elements.

16. The method of claim 15, wherein the elevated portion of the IMC has a shape of a ring or concentric rings.

17. The method of claim 15, wherein a peripheral edge of the seed layer overlaps the width of the hall elements.

18. The method of claim 1, wherein the hall elements comprise a first hall element and a second hall element, and wherein the protrusion of the protection layer is disposed to overlap an area between the first hall element and the second hall element.

19. The method of claim 1, wherein forming the protection layer comprises:

forming a first buffer layer disposed above the hall elements; and forming a second buffer layer disposed above the first buffer layer, wherein the second buffer layer comprises the protrusion of the protection layer.

20. The method of claim 9, wherein the hall elements comprise a first hall element and a second hall element, and wherein at least one of the protrusions is disposed to overlap an area between the first hall element and the second hall element.

21. The method of claim 15, further comprising:

forming a protection layer comprising a thin portion having a first thickness and comprising a thick portion having a second thickness that forms a protrusion that protrudes upward from an upper surface of the protection layer.

22. The method of claim 15, wherein the hall elements comprise a first hall element and a second hall element, and wherein the elevated portion of the IMC is disposed to overlap an area between the first hall element and the second hall element.

* * * * *